(12) United States Patent
Kobayashi et al.

(10) Patent No.: US 12,192,665 B2
(45) Date of Patent: Jan. 7, 2025

(54) SOLID-STATE IMAGING DEVICE AND IMAGING SYSTEM

(71) Applicant: CANON KABUSHIKI KAISHA, Tokyo (JP)

(72) Inventors: Masahiro Kobayashi, Tokyo (JP); Mineo Shimotsusa, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/390,605

(22) Filed: Jul. 30, 2021

(65) Prior Publication Data

US 2021/0360186 A1 Nov. 18, 2021

Related U.S. Application Data

(63) Continuation of application No. 16/393,662, filed on Apr. 24, 2019, now Pat. No. 11,102,440, which is a (Continued)

(30) Foreign Application Priority Data

Jun. 30, 2010 (JP) .................................. 2010-149484

(51) Int. Cl.
*H04N 25/79* (2023.01)
*H01L 27/02* (2006.01)
(Continued)

(52) U.S. Cl.
CPC ......... *H04N 25/79* (2023.01); *H01L 27/0255* (2013.01); *H01L 27/0296* (2013.01);
(Continued)

(58) Field of Classification Search
CPC ................ H04N 5/379; H01L 27/0255; H01L 27/0296; H01L 27/146; H01L 27/14636;
(Continued)

(56) References Cited

U.S. PATENT DOCUMENTS 10,304,899 B2 * 5/2019 Kobayashi ........ H01L 27/14685
2004/0217394 A1 * 11/2004 Lee .................... H01L 27/14689
257/292
(Continued)

FOREIGN PATENT DOCUMENTS

JP 2005-026582 A 1/2005
JP 2006-191081 A 7/2006
(Continued)

*Primary Examiner* — Mekonnen D Dagnew
(74) *Attorney, Agent, or Firm* — Canon U.S.A., Inc. IP Division

(57) ABSTRACT

A solid-state imaging device includes: a first semiconductor substrate including a photoelectric conversion element; and a second semiconductor substrate including at least a part of a peripheral circuit arranged in a main face of the second semiconductor substrate, the peripheral circuit generating a signal based on the charge of the photoelectric conversion element, a main face of the first semiconductor substrate and the main face of the second semiconductor substrate being opposed to each other with sandwiching a wiring structure therebetween; a pad to be connected to an external terminal; and a protection circuit electrically connected to the pad and to the peripheral circuit, wherein the protection circuit is arranged in the main face of the second semiconductor substrate.

42 Claims, 12 Drawing Sheets

Related U.S. Application Data continuation of application No. 15/868,804, filed on Jan. 11, 2018, now Pat. No. 10,304,899, which is a continuation of application No. 14/992,234, filed on Jan. 11, 2016, now Pat. No. 9,899,449, which is a continuation of application No. 13/807,084, filed as application No. PCT/JP2011/003570 on Jun. 22, 2011, now Pat. No. 9,252,169.

(51) Int. Cl.
*H01L 27/146* (2006.01)
*H10K 65/00* (2023.01)

(52) U.S. Cl.
CPC ...... *H01L 27/146* (2013.01); *H01L 27/14636* (2013.01); *H01L 27/1464* (2013.01); *H01L 27/14685* (2013.01); *H01L 27/14689* (2013.01); *H10K 65/00* (2023.02); *H01L 27/14645* (2013.01)

(58) Field of Classification Search
CPC ........... H01L 27/1464; H01L 27/14685; H01L 27/14689; H01L 27/288; H01L 27/14645
See application file for complete search history.

(56) References Cited

U.S. PATENT DOCUMENTS

| | | | | |
|---|---|---|---|---|
| 2009/0020842 | A1* | 1/2009 | Shiau | H01L 27/14636 257/459 |
| 2009/0085143 | A1* | 4/2009 | Park | H01L 27/1464 216/13 |
| 2009/0134497 | A1* | 5/2009 | Barth | H01L 23/481 257/E21.477 |
| 2009/0146148 | A1* | 6/2009 | Pyo | H01L 27/14632 257/E31.127 |
| 2009/0185060 | A1* | 7/2009 | Akiyama | H01L 27/14632 257/E31.11 |
| 2009/0224345 | A1* | 9/2009 | Lee | H01L 27/14687 257/E31.127 |
| 2010/0181283 | A1* | 7/2010 | Chuang | H01L 27/14687 216/13 |
| 2010/0214457 | A1* | 8/2010 | Sakai | H01L 27/1463 257/431 |
| 2010/0238331 | A1* | 9/2010 | Umebayashi | H01L 27/1464 257/E31.097 |
| 2010/0238334 | A1* | 9/2010 | Takahashi | H04N 5/353 257/E31.097 |
| 2010/0244175 | A1* | 9/2010 | Park | H04N 5/2257 257/E31.113 |
| 2010/0245647 | A1* | 9/2010 | Honda | H04N 5/2257 348/308 |
| 2010/0328916 | A1* | 12/2010 | Hirose | H01L 27/0255 361/783 |
| 2011/0018129 | A1* | 1/2011 | Suzuki | H01L 24/17 257/737 |

FOREIGN PATENT DOCUMENTS

| | | |
|---|---|---|
| JP | 2008-177246 A | 7/2008 |
| JP | 2008-536330 A | 9/2008 |
| JP | 2009-277732 A | 11/2009 |
| JP | 2010-073913 A | 4/2010 |

* cited by examiner

SOLID-STATE IMAGING DEVICE AND IMAGING SYSTEM

CROSS-REFERENCE TO RELATED APPLICATION

This application is a Continuation of U.S. application Ser. No. 16/393,662, filed Apr. 24, 2019; which is a Continuation of U.S. application Ser. No. 15/868,804, filed Jan. 11, 2018, now U.S. patent Ser. No. 10/304,899, issued Jan. 23, 2019; which is a Continuation of U.S. application Ser. No. 14/992,234, filed Jan. 11, 2016, now becomes U.S. Pat. No. 9,899,449, issued Feb. 20, 2018; which is a Continuation of U.S. application Ser. No. 13/807,084, filed Dec. 27, 2012, now becomes U.S. Pat. No. 9,252,169, issued Feb. 2, 2016; which is a National Phase Application of International Application PCT/JP2011/003570 filed Jun. 22, 2011, which claims priority from Japanese Patent Application No. 2010-149484 filed Jun. 30, 2010, which are hereby incorporated by reference herein in their entireties.

TECHNICAL FIELD

The present invention relates to a solid-state imaging device and, in particular, to a pad part thereof.

BACKGROUND ART

In a charge-coupled device (CCD) type or an amplification type solid-state imaging device used in a digital still camera, a cam coder or the like, there is a demand for finer pixels to obtain a high definition image. However, the finer the pixels, the smaller the light receiving area of a photoelectric conversion element for detecting light included in the pixels, resulting in a reduction in sensitivity.

Japanese Patent Application Laid-Open No. 2006-191081 discusses complementary metal-oxide-semiconductor (CMOS) type, which is also an amplification type, solid-state imaging device of a construction in which a first substrate with a photoelectric conversion element and a transfer transistor arranged thereon and a second substrate with another circuit arranged thereon are bonded to each other to form a solid-state imaging device to secure the requisite light receiving area of the photoelectric conversion element.

Further, Japanese Patent Application Laid-Open No. 2006-191081 discusses a solid-state imaging device in which a connection portion extending through a second substrate is connected to an input/output pad to effect connection of the input/output pad from the back-side of the second substrate. This input/output pad is formed after the connection portion is exposed by polishing of the second substrate.

However, Japanese Patent Application Laid-Open No. 2006-191081 discusses a construction in which the input/output pad is directly connected to the circuit of the first substrate. In such a construction, external noise from an external terminal is imparted to the circuit of the first substrate, so that a malfunction of the circuit can be generated. Further, a photoelectric conversion element is arranged on the first substrate, and incorporation of external noise may affect the image signal.

CITATION LIST

Patent Literature

[PTL 1]
Japanese Patent Application Laid-Open No. 2006-191081

SUMMARY OF INVENTION

The present invention is directed to reduce a incorporation of an external noise from a pad into a photoelectric conversion element.

According to an aspect of the present invention, a solid-state imaging device includes: a first semiconductor substrate including a photoelectric conversion element; and a second semiconductor substrate including at least a part of a peripheral circuit arranged in a main face of the second semiconductor substrate, the peripheral circuit generating a signal based on the charge of the photoelectric conversion element, a main face of the first semiconductor substrate and the main face of the second semiconductor substrate being opposed to each other with sandwiching a wiring structure therebetween; a pad to be connected to an external terminal and a protection circuit electrically connected to the pad and to the peripheral circuit, wherein the protection circuit is arranged in the main face of the second semiconductor substrate.

According to the present invention, it is possible to mitigate incorporation of external noise from the pad into the photoelectric conversion element.

Further features and aspects of the present invention will become apparent from the following detailed description of exemplary embodiments with reference to the attached drawings.

BRIEF DESCRIPTION OF DRAWINGS

The accompanying drawings, which are incorporated in and constitute a part of the specification, illustrate exemplary embodiments, features, and aspects of the invention and, together with the description, serve to explain the principles of the invention.

DESCRIPTION OF EMBODIMENTS

Various exemplary embodiments, features, and aspects of the invention will be described in detail below with reference to the drawings.

A solid-state imaging device according to the present invention comprises a first semiconductor substrate including a photoelectric conversion element, and a second semiconductor substrate including at least a part of a peripheral circuit. The peripheral circuit is for generating a signal based on the charge of the photoelectric conversion element and is arranged in a main face thereof. A main face of the first semiconductor substrate and the main face of the second semiconductor substrate are opposed to each other with sandwiching a wiring structure therebetween. The solid-state imaging device comprises a pad to be connected to an external terminal, and a protection circuit electrically connected to the pad and to the peripheral circuit. The protection circuit is arranged in the main face of the second semiconductor substrate. By thus arranging the protection circuit on the second substrate, it is possible to mitigate incorporation of external noise from the external terminal and to protect a circuit on a succeeding stage. Further, it is possible to suppress the incorporation of the external noise from the external terminal into the photoelectric conversion element.

In the following, the present invention will be described in detail with reference to the drawings. In the description of the exemplary embodiments, the main face of the first substrate and the main face of the second substrate are the front-side faces of the substrates on which transistors are formed. The faces on the opposite side of the main faces (front-side faces) are the back-side face of the first substrate and the back-side face of the second substrate. The upward direction is from the back-side face toward the main face (front-side face), and the downward direction and the depth direction are direction from the main face (front-side face) toward the back-side face of the substrate.

The first exemplary embodiment of the present invention will be described with reference FIGS. 1 through 6B. In the present exemplary embodiment, a protection diode circuit is used as the protection circuit.

Figure 3:
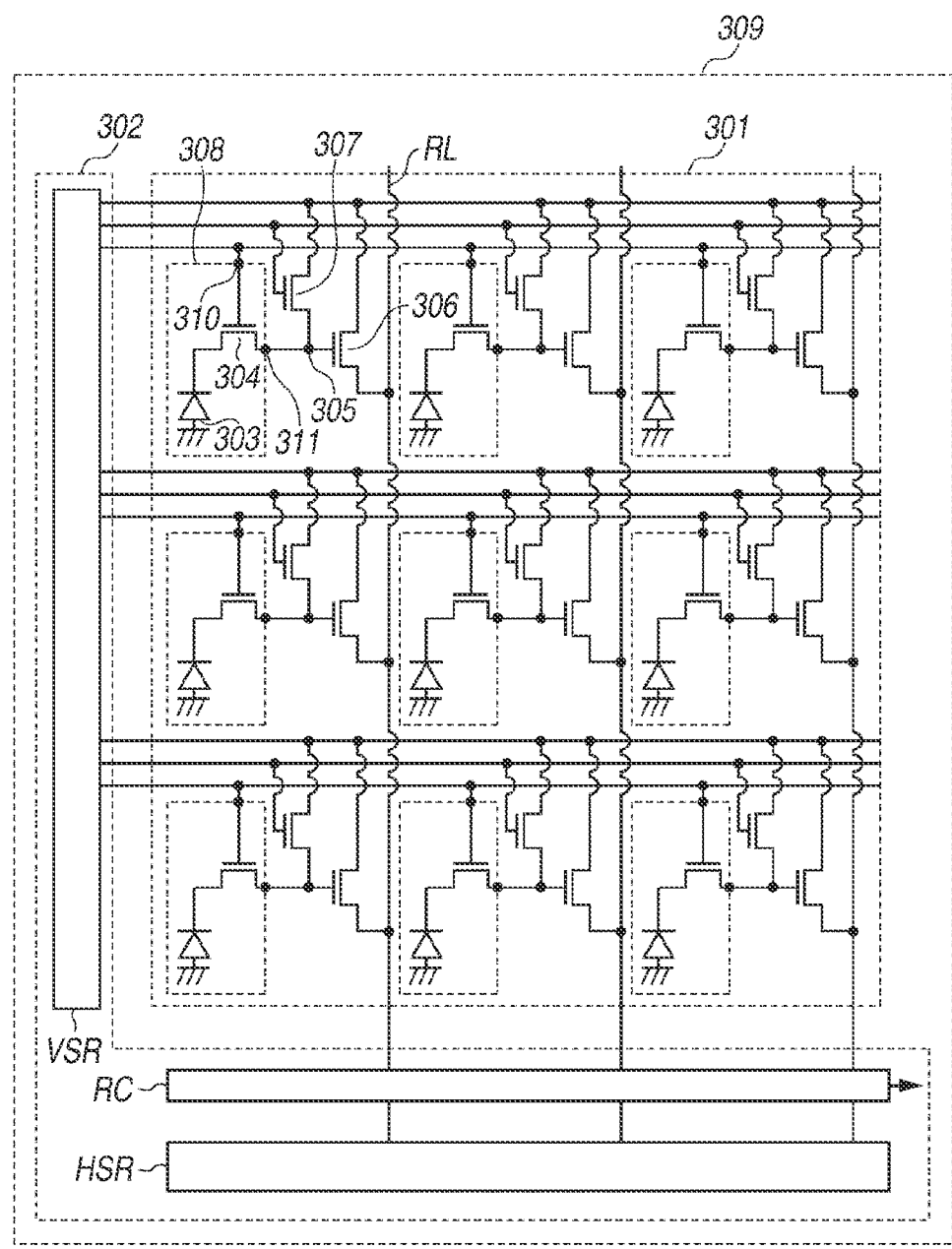
FIG. 3 is a circuit diagram of the solid-state imaging device of the first exemplary embodiment.

First, the circuit of the solid-state imaging device of the first exemplary embodiment will be described with reference to FIG. 3. In the present exemplary embodiment described below, the signal charge consists, for example, of electrons. The solid-state imaging device of FIG. 3 includes a pixel part 301 in which a plurality of photoelectric conversion elements are arranged. Further, the solid-state imaging device includes a peripheral circuit part 302 where there is arranged a peripheral circuit that may include a reading circuit configured to read a signal from the pixel part 301, a control circuit for driving the reading, and a signal processing circuit configured to process the read signal.

In the pixel part 301, there are arranged a plurality of photoelectric conversion elements 303, transfer transistors 304, amplification transistors 306, and reset transistors 307. A pixel is configured with a constitution including at least one photoelectric conversion element. One pixel of the present exemplary embodiment includes a photoelectric conversion element 303, a transfer transistor 304, an amplification transistor 306, and a reset transistor 307. The anode of the photoelectric conversion element 303 is grounded. The source of the transfer transistor 304 is connected to the cathode of the photoelectric conversion element 303, and the drain region of the transfer transistor 304 is connected to the gate electrode of the amplification transistor 306. A node that is identical with the gate electrode of the amplification transistor 306 will be referred to as a node 305. The reset transistor is connected to the node 305, and sets the potential of the node 305 to an arbitrary potential (e.g., reset potential). The amplification transistor 306 is a part of a source follower circuit, and outputs a signal according to the potential of the node 305 to a signal line RL. In some cases, the node 305 is also referred to as a floating diffusion. A circuit including the transfer transistor 304, the amplification transistor 306, and the reset transistor 307 is a pixel circuit.

The peripheral circuit part 302 represents the region other than the pixel part 301. In the peripheral circuit part 302, there is arranged a peripheral circuit including a readout circuit and a control circuit. The peripheral circuit has a vertical scanning circuit VSR, which is a control circuit for supplying a control signal to the gate electrode of each transistor of the pixel part 301. Further, the peripheral circuit has a readout circuit RC configured to retain a signal output from the pixel part 301 and to perform signal processing such as amplification, addition, and analog-digital (AD) conversion. Further, the peripheral circuit has a horizontal scanning circuit HSR, which is a control circuit configured to control the timing with which signals are successively output from the readout circuit RC. By operating the peripheral circuit, there is generated a signal according to a signal output from the signal line RL of the pixel circuits. Naturally, this signal is a signal based on the charge of each photoelectric conversion element 303.

The solid-state imaging device of the first exemplary embodiment is formed by bonding two members to each other. The two members consist of a first member 308 including a first substrate 101 and a second member 309 including a second substrate 121. The first substrate 101 includes the photoelectric conversion elements 303 and the transfer transistors 304 of the pixel part 301, and, the second substrate 121 includes the amplification transistors 306 and the reset transistors 307 of the pixel part 301 and the peripheral circuit part 302. A control signal is supplied from the peripheral circuit part 302 of the second member 309 to the gate electrode of each transfer transistor 304 of the first member 308 via a connection portion 310. The construction of the connection portion 310 will be described below. A signal generated by each photoelectric conversion element 303 of the first member 308 is read out at the drain region of each transfer transistor 304, that is, at each node 305. Each node 305 includes a structure arranged on the first member 308 and a structure arranged on the second member 309.

Owing to this construction, as compared with the conventional case where the entire pixel part is arranged on one member (that is, on one substrate), it is possible to increase the area of the photoelectric conversion elements 303, enabling to achieve an improvement in terms of sensitivity. Further, as compared with the conventional case where the entire pixel part is arranged on one member (that is, on one substrate), it is possible to provide more photoelectric conversion elements of the same area, enabling to increase the number of pixels. At least the photoelectric conversion elements are necessary to be arranged on the first substrate, and the amplification transistors 306 may be arranged on the first substrate. Further, the photoelectric conversion elements and the gate electrodes of the amplification transistors can be connected to each other without providing the transfer transistors. In the present invention, the elements arranged on the first substrate can be arbitrarily selected, and the construction of the pixel circuit also can be arbitrarily selected.

Figure 2A:
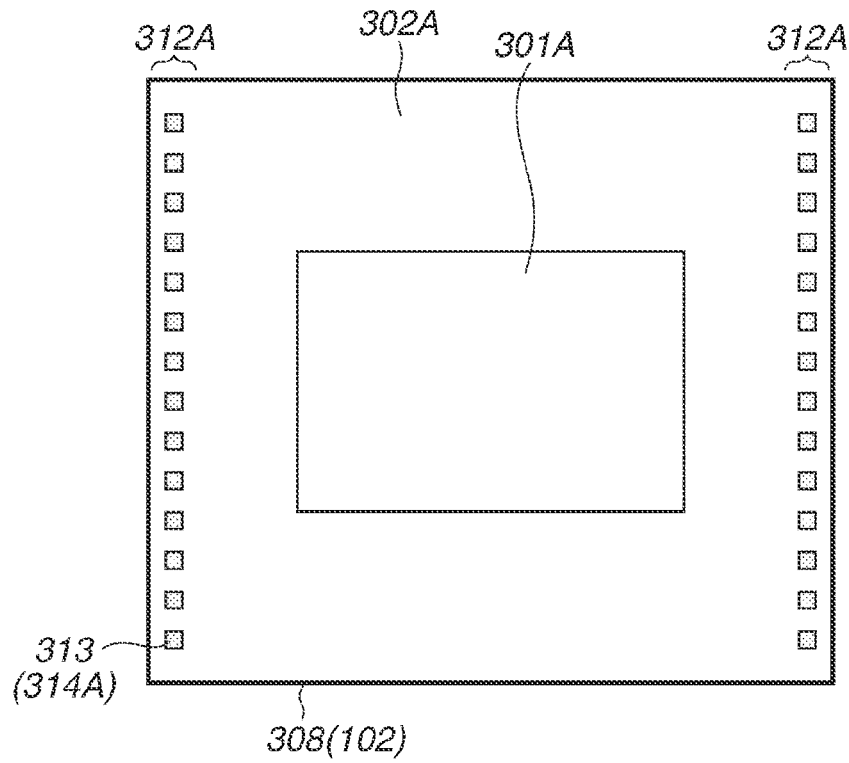
FIG. 2A is a schematic plan view of the solid-state imaging device of the first exemplary embodiment.

A specific plan layout of such a solid-state imaging device will be described with reference to FIGS. 2A and 2B, which are schematic plan views of a solid-state imaging device. FIG. 2A illustrates the plan layout on the first member 308, that is, the first substrate (101), and FIG. 2B illustrates the plan layout of the second member 309, that is, the second substrate (121).

In FIG. 2A, on the first member 308, there are arranged a pixel part 301A in which a plurality of photoelectric conversion elements are arranged, and a pad part 312A where pads 313 are arranged. In the pixel part 301A, there are arranged a plurality of photoelectric conversion elements 303, transfer transistors 304, and connection portions 310 and 311 as illustrated in FIG. 3. In the pad part 312A, there is arranged a connection portion 314A for connection with the second member 309 at the same position in a planar direction as the pads 313. An external terminal is to be connected to the pads 313. An example of the external terminal is a bonding wire connected to the pads 313 by the wire bonding method. In the solid-state imaging device, there are arranged a plurality of pads 313, which include a pad (output pad) for outputting a signal (image signal) based on the charge generated by the photoelectric conversion elements, and a pad (input pad) to which a voltage supplied from the outside to drive the peripheral circuit, for example, is input.

Figure 1:
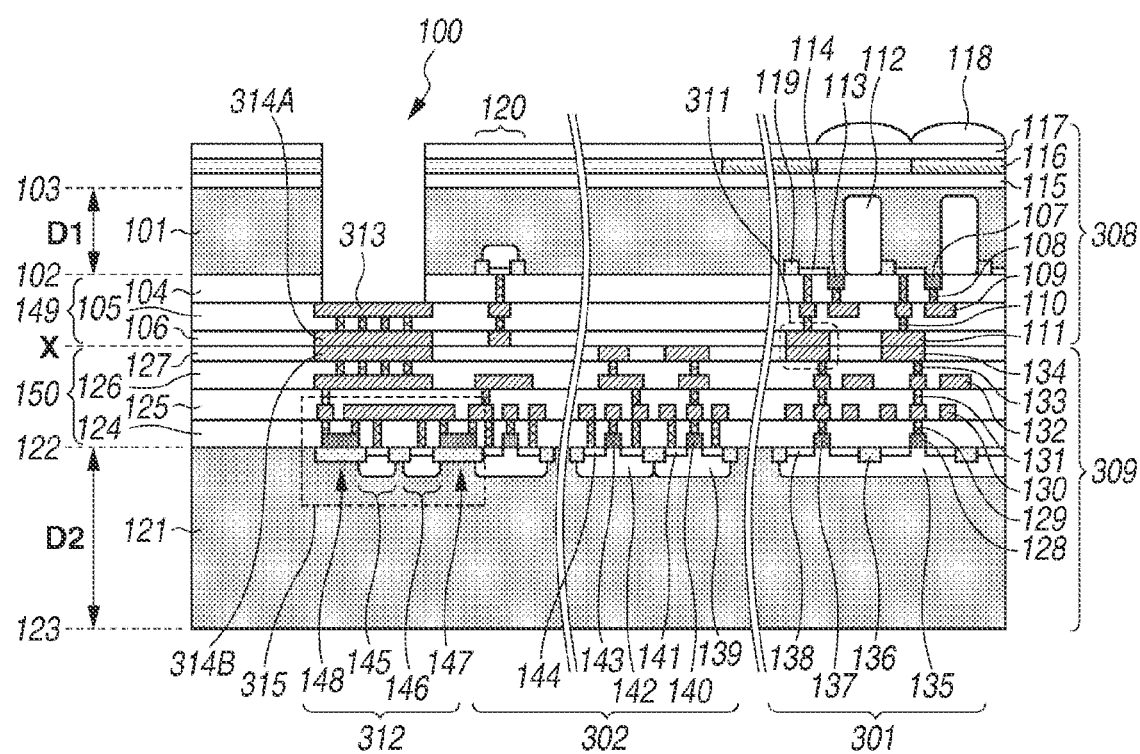
FIG. 1 is a schematic sectional view of a solid-state imaging device according to a first exemplary embodiment.
Figure 2B:
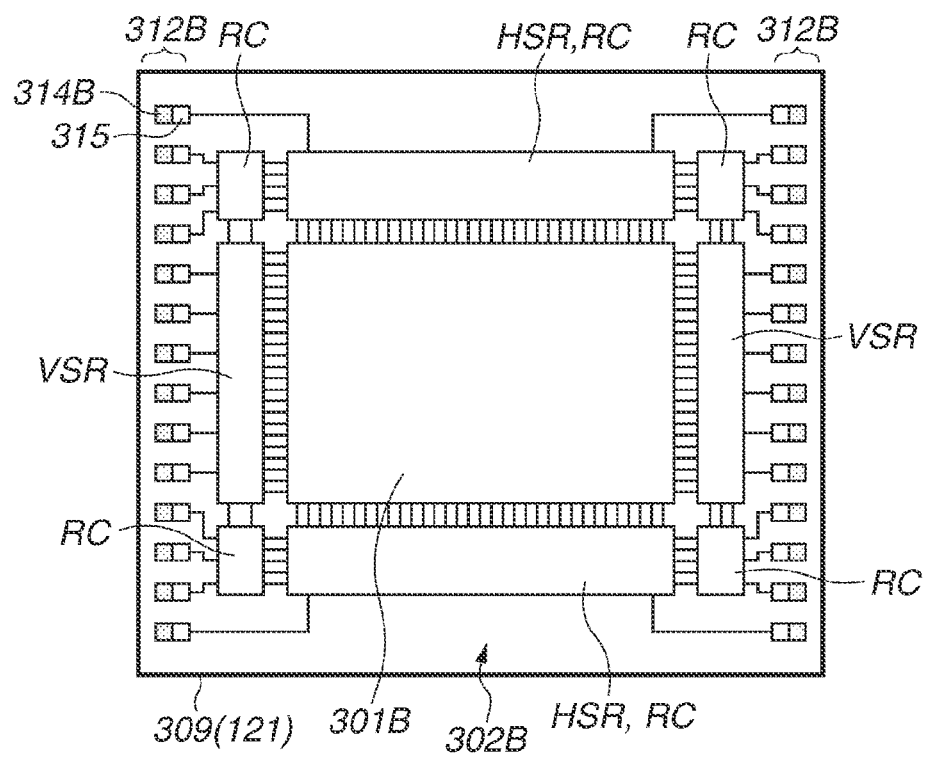
FIG. 2B is a schematic plan view of the solid-state imaging device of the first exemplary embodiment.

Next, in FIG. 2B, there are arranged on the second member 309 a pixel part 301B, the peripheral circuit part 302B, and a pad part 312B. Apart of the pixel circuits is arranged in the pixel part 301B; a plurality of amplification transistors 306, reset transistors 307, connection portions 310, and connection portions 311 as illustrated in FIG. 3 are arranged. In the peripheral circuit part 302B, there are arranged the horizontal scanning circuit HSR, the vertical scanning circuit VSR, and the readout circuit RC. In the pad part 312B, there are arranged a connection portion 314B for connection with the first member, and a protection diode circuit 315. As will be illustrated in detail with reference to FIG. 1, the connection portion 314 B is arranged at the same position in a planar direction as the protection diode circuit 315. Owing to the arrangement of the protection diode circuit 315, it is possible to mitigate incorporation of external noise from the external terminal. Further, it is possible to protect the circuit on the succeeding stage against erroneous input and surge voltage. The protection diode circuit 315 is electrically connected to the peripheral circuit. More specifically, as illustrated in FIG. 2B, there are provided a plurality of protection diode circuits 315, and the protection diode circuit 315 connected to each pad 313 is connected to a vertical scanning circuit VSR, a horizontal scanning circuit HSR, or a readout circuit RC. And, by arranging the protection diode circuits 315 on the second member 309, it is possible to reduce transmission of external noise to the photoelectric conversion element. Further, when an abnormal signal is generated within the solid-state imaging device, the protection diode circuit 315 connected to the output pad will be able to suppress the output of this abnormal signal to the exterior of the device.

And, the solid-state imaging device of the present exemplary embodiment is formed by bonding together the first member 308 and the second member 309 of the plan layout as illustrated in FIGS. 2A and 2B. More specifically, the arrangement is made such that the pixel part 301A and the pixel part 301B overlap each other. And, the connection portion 314A and the connection portion 314B are connected to each other, and the connection portion 310 and the connection portion 311 of the first member and the connection portion 310 and the connection portion 311 of the second member are connected to each other. In FIGS. 2A and 2B, the region of the first member 308 corresponding to the peripheral circuit part 302B of the second member 309 is indicated as the peripheral circuit part 302A. A part of the scanning circuit, that is, a part of the peripheral circuit, may be arranged in the peripheral circuit part 302A.

Figure 10A:
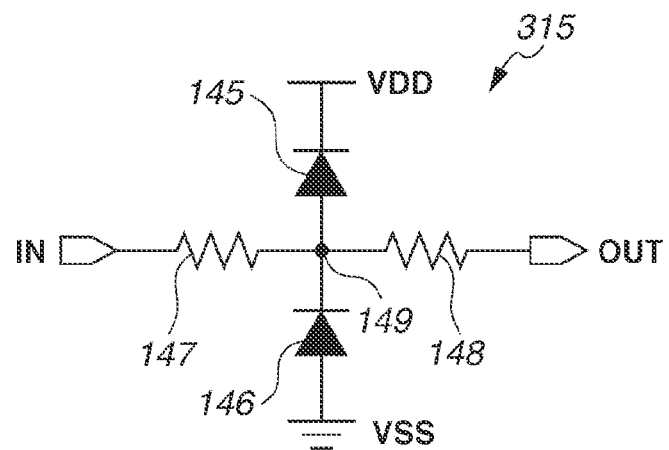
FIG. 10A is a circuit diagram of a protection diode.
Figure 10B:
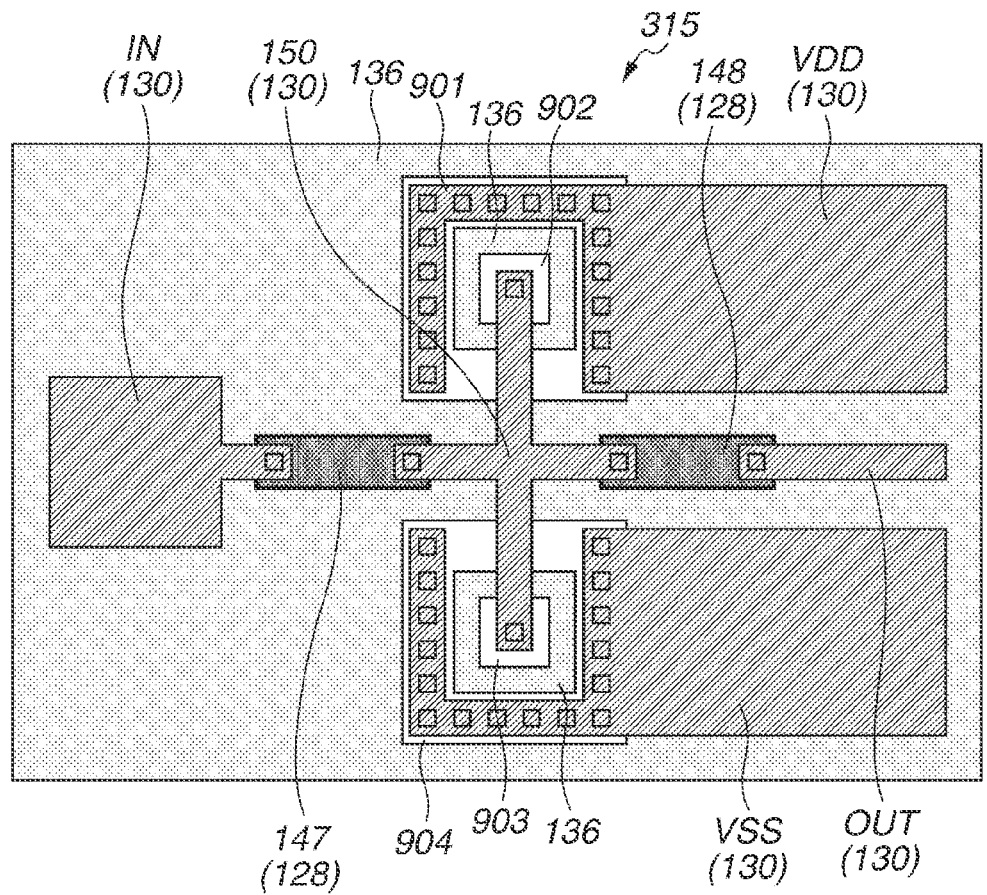
FIG. 10B is a schematic plan view of a protection diode.
Figure 11A:
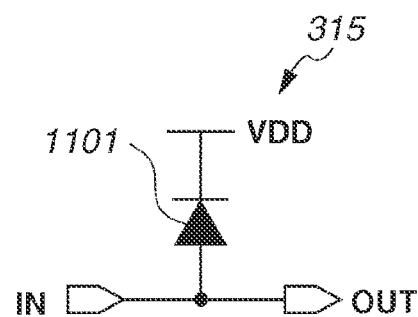
FIG. 11A is a circuit diagram of a protection diode.
Figure 11B:
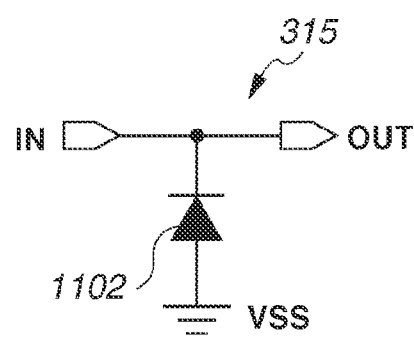
FIG. 11B is a circuit diagram of a protection diode.

The construction of the protection diode circuit 315 will be described with reference to FIGS. 10A and 10B and FIGS. 11A and 11B. FIG. 10A is a circuit diagram illustrating a certain protection diode circuit, and FIG. 10B is a diagram illustrating a plan layout corresponding thereto. FIGS. 11A and 11B are circuit diagrams illustrating a protection diode circuit of a different construction from that of FIGS. 10A and 10B. Regarding the plan layout of the protection diode circuit of FIGS. 11A and 11B, a description thereof will be omitted. In the present exemplary embodiment, protection diode circuits as illustrated in FIGS. 10A and 10B and FIGS. 11A and 11B are appropriately selected and provided as the plurality of protection diode circuits 315 illustrated in FIGS. 2A and 2B.

The protection diode circuit illustrated in FIG. 10A has an input terminal IN and an output terminal OUT, two resistors (hereinafter referred to as a first resistor 147 and a second resistor 148), and two diodes (hereinafter referred to as a first diode 145 and a second diode 146). In the protection diode circuit, the input terminal and a terminal of the resistor 147 are connected to each other, and the other terminal of the first resistor 147 is connected to the anode of the first diode 145, the cathode of the second diode 146, and a terminal of the second resistor 148. And, the other terminal of the second resistor 148 is connected to the output terminal. In other words, at a node 149, the other terminal of the first resistor 147, the anode of the first diode 145, the cathode of the second diode 146, and a terminal of the second resistor 148 are connected to each other. The cathode of the first diode 145 is connected to a predetermined voltage (VDD), and the anode of the second diode 146 is connected to another voltage (VSS) different from the predetermined voltage. Here, the voltages are in the following relationship: VDD>the voltage at the input terminal IN>VSS. It is only necessary for the voltage VSS to be a voltage lower than the voltage VDD; as indicated by a circuit symbol in FIG. 10A, it may be a grounding voltage (GND).

Owing to this circuit form, when, for example, there is input to the input terminal IN a voltage larger than the sum total of the voltage VDD and the forward voltage drop at the first diode 145, a forward bias is applied to the first diode 145, and an electric current flows from the node 149 to VDD. Thus, it is possible to prevent application to the circuit on the succeeding stage of a voltage larger than the sum total of VDD and the forward voltage drop at the first diode 145. When there is input to the input terminal IN a voltage smaller than the difference between VSS and the forward voltage at the second diode 146, a forward bias is applied to the second diode 146, and electric current flows from VSS to the node 149. Thus, it is possible to prevent application to the circuit on the succeeding stage of a voltage smaller than the difference between VSS and the forward voltage at the second diode 146. Further the resistors 147 and 148 serve to lower the input voltage and to reduce the absolute value of the voltage applied to the output side.

Next, FIG. 10B is a corresponding plan view. A contact is indicated by a square. The contact is included in a contact layer. First, element separation structures 136 are arranged in the protection diode circuit. The input terminal IN consisting of wiring included in a wiring layer 130 is connected to the first resistor 147 consisting of wiring included in a gate electrode layer 128. The other terminal of the first resistor 147 is connected to wiring 150 of the wiring layer 130 via the contact. The wiring 150 is connected to a p-type semiconductor region 902 forming the anode of the first diode 145 via the contact, and is connected to an n-type semiconductor region 903 forming the cathode of the second diode 146 via the contact. And, the wiring layer 150 is connected to the second resistor 148 consisting of wiring included in the gate electrode layer 128 via the contact. In other words, the node 149 of FIG. 10A is formed by the wiring 150, the first resistor 147, the second resistor 148, the p-type semiconductor region 902, and the n-type semiconductor region 903 of FIG. 10A and the contact connecting them together. And, the n-type semiconductor region 901 constituting the cathode of the first diode 145 is included in the wiring layer 130, and is connected to wiring VDD supplying the predetermined voltage (VDD) via a plurality of contacts. The p-type semiconductor region 904 constituting the anode of the second diode 146 is included in the wiring layer 130, and is connected to the wiring VSS supplying the predetermined voltage (VSS) via a plurality of contacts. Here, each diode is surrounded by the element separation structure 136, and, even if there is generated a fluctuation due to a signal input, it is possible to mitigate the influence thereof on the other circuits. Further, to achieve an improvement in terms of withstand voltage between the semiconductor regions, the element separation structure 136 is also provided between the semiconductor regions constituting the anode and the cathode and the contact for supplying voltage thereto.

The protection diode circuit of FIG. 1A is composed of an input terminal IN, an output terminal OUT, and one diode 1101; the anode of the diode 1101 is connected to the input terminal IN and the output terminal OUT, with the cathode being connected to a predetermined voltage (VDD). The protection diode circuit of FIG. 11B is composed of an input terminal IN, an output terminal OUT, and one diode 1102; the cathode of the diode 1102 is connected to the input terminal IN and the output terminal OUT, and the anode thereof is connected to a predetermined voltage (voltage VSS lower than the voltage VDD).

In the present exemplary embodiment, the protection diode circuit of FIG. 11A is arranged in correspondence with a pad to which a predetermined voltage (the voltage VSS that is lower than the voltage VDD) is input. The protection diode circuit of FIG. 11B is arranged in correspondence with a pad to which a predetermined voltage (the voltage VDD that is higher than the voltage VSS) is input. The protection diode circuit of FIGS. 10A and 10B is arranged in correspondence with a pad to or from which another signal is input or output. As needed, the protection diode circuit of FIGS. 10A and 10B may be arranged in correspondence with the input pad, and the protection diode circuit of FIG. 11A or 11B may be arranged in correspondence with the output pad. As described above, external noise is caused, for example, by erroneous input, voltage surge, etc. In particular, from the viewpoint of protecting the peripheral circuit from voltage surge generated by electro-static discharge (ESD), it is very meaningful to arrange the protection diode circuit 315 on the second substrate 121. The possibility of incorporation of voltage surge due to electro-static discharge is high regardless of whether it is an input pad or an output pad, so that it is desirable for the protection diode circuit to be arranged in correspondence with both the input pad and the output pad. Of course, it is also possible to apply a structure different from those of the above three kinds of protection diode circuit to the protection diode circuit 315 of the present exemplary embodiment. For example, the resistors 147 and 148 may be formed solely by resistance of metal wiring; the resistors 147 and 148 may not be provided; and VSS may be connected to other than GND.

Next, the solid-state imaging device illustrated in the schematic sectional views of FIGS. 2A, 2B, and 3 will be described with reference to FIG. 1. In FIG. 1, the components that are the same as those of FIGS. 2A, 2B, and 3 are denoted by the same reference numerals, and a description thereof will be omitted.

The first member 308 includes the first wiring structure 149 and the first substrate 101. The first substrate 101 is configured with, for example, of a silicon semiconductor substrate, and has a main face 102 and a back-side face 103. A transistor is arranged in the main face 102 of the first substrate. The first wiring structure 149 includes inter-layer insulating films 104 through 106, a gate electrode layer 107 including a gate electrode and wiring, wiring layers 109 and 111 including a plurality of wirings, and contact layers 108 and 110 including a plurality of contacts or vias. Here, the number of layers of the inter-layer insulating films, of the wiring layers, and of the contact layers included in the first wiring structure 149 may be arbitrarily set. The wiring layer 111 of the first wiring structure 149 includes a connection portion.

In the pixel part 301 of the first member 308, there are arranged on the first substrate 101 an n-type semiconductor region 112 constituting a photoelectric conversion element, an n-type semiconductor region 114 constituting the drain of a transfer transistor, and an element separation structure 119. The transfer transistor is formed by the n-type semiconductor region 112, the n-type semiconductor region 114, and a gate electrode 113 included in the gate electrode layer 107. Here, the charge accumulated in the n-type semiconductor region 112 is transferred to the n-type semiconductor region 114 by the gate electrode 113. The potential based on the charge transferred to the n-type semiconductor region 114 is transmitted to the second member 309 via a contact of the contact layer 108, wiring of the wiring layer 109, a via of the contact layer 110, and wiring of the wiring layer 111. The wiring of the wiring layer 111 constitutes the connection portion 311. The photoelectric conversion element may be an embedded photo diode further including a p-type semiconductor region, or a photo gate, thus allowing modification as appropriate.

On the back-side face 103 side of the first substrate 101 of the pixel part 301, there arranged a planarization layer 115, a color filter layer 116 including a plurality of color filters, a planarization layer 117, and a micro lens layer 118 including a plurality of micro lenses in this order. In FIG. 1, each of the plurality of color filters and of the plurality of micro lenses is arranged in correspondence with one photoelectric conversion element, that is, for each pixel; however, it is also possible for one color filter and one micro lens to be provided for a plurality of pixels. The solid-state imaging device of the present exemplary embodiment is a back-side face irradiation type solid-state imaging device in which light enters from the micro lens layer 118 side and is received by the photoelectric conversion element.

In the pad part 312 of the first member 308, there are arranged a pad 313 and an opening 100 through which the pad for connection to an external terminal is exposed. Further, there is arranged a connection portion 314A configured to conduct a voltage input from the pad 313 to the second member 309. The connection portion 314A is arranged at the same position in a planar direction as the pad 313. In the first member 308, in a region corresponding to the peripheral circuit part 302 of the second member 309, there is provided an arbitrary circuit element 120 as illustrated in FIG. 1.

The second member 309 has a second wiring structure 150 and a second substrate 121. The second substrate 121 is configured with, for example, of a silicon semiconductor substrate, and has a main face 122 and a back-side face 123. A transistor is arranged on the main face 122 of the second substrate. The second wiring structure 150 has inter-layer insulating films 124 through 127, a gate electrode layer 128 including a gate electrode and wiring, wiring layers 130, 132, and 134 including a plurality of wirings, and contact layers 129, 131, and 133 including a plurality of contacts or vias. Here, the number of layers of the inter-layer insulating films, of the wiring layers, and of the contact layers included in the second wiring structure 150 can be arbitrarily set. The wiring layer 134 includes a connection portion.

In the pixel part 301 of the second member 309, there are arranged a well 135 constituting an amplification transistor of a pixel circuit, an n-type semiconductor region 138 constituting the source/drain region of the amplification transistor, and an element separation structure 136, in the second substrate 121. The amplification transistor is arranged in the well 135, and is formed by a gate electrode 137 included in the gate electrode layer 128, and an n-type semiconductor region 138 constituting a source/drain region. Here, the connection portion 311 of the first member 308 and the gate electrode 137 of the amplification transistor are connected to each other via the wiring of the wiring layer 134, a via of the contact layer 133, the wiring of the wiring layer 132, a via of the contact layer 131, the wiring of the wiring layer 130, and the contact of the contact layer 129. The node 305 of FIG. 3 is composed of the n-type semiconductor region 114 of FIG. 1, the wirings of the wiring layers 109, 111, 134, 132, and 130, the contacts or vias of the contact layers 108, 110, 133, 131, and 129, and the gate electrode 137. Another circuits of the pixel part 301 (e.g., a reset transistor) are not illustrated.

Next, in the peripheral circuit part 302 of the second member 309, there is arranged at least a part of a peripheral circuit including control circuits such as a horizontal scanning circuit and a vertical scanning circuit and a readout circuit. FIG. 1 illustrates an n-type transistor and a p-type transistor of an arbitrary circuit included in the peripheral circuit. An n-type transistor consisting of a gate electrode 140 included in the gate electrode layer 128 and an n-type source/drain region 141 are arranged in a p-type well 139. And, a p-type transistor having a gate electrode 143 included in the gate electrode layer 128 and a p-type semiconductor region 144 constituting a p-type source/drain region is arranged in an n-type well 142.

And, in the pad part 312 of the second member 309, there are arranged a protection diode circuit 315 for inputting a signal from a pad 313 of the first member 308, and a connection portion 314B for connection with the first member 308. The connection portion 314B is arranged at the same position in a planar direction as the protection diode circuit 315. The protection diode circuit 315 has configuration of FIGS. 10A and 10B. Specifically, it includes two diodes 145 and 146 formed by semiconductor regions, and two resistors 147 and 148 formed by the gate electrode layer 128. The input terminal IN, the output terminal OUT, and the wiring 150 are formed by the wiring constituting the wiring layer 130 illustrated in FIG. 1. Further, the wirings of the first resistor 147 and the second resistor 148 of FIG. 10B are configured with the wiring constituting the electrode layer 128 illustrated in FIG. 1. Further, the protection diode circuit 315 is arranged between the pad 313 connected to the external terminal and the circuit of the peripheral circuit part 302. Owing to this configuration, it is possible to suppress the external noise from the external terminal.

And, in the solid-state imaging device of the present exemplary embodiment, the main face 102 of the first substrate 101 and the main face 122 of the second substrate 121 are opposed to each other with sandwiching the first and second wiring structures therebetween (opposing arrangement). In other words, the first substrate, the first wiring structure, the second wiring structure, and the second substrate are arranged in this order. Further, the upper face of the first wiring structure 149 and the upper face of the second wiring structure 150 are to be regarded as bonded to each other at a bonding interface X. That is, the first member 308 and the second member 309 are bonded to each other at the bonding interface X. The bonding interface X is formed by the upper face of the first wiring structure 149 and the upper face of the second wiring structure 150. As a result, the first wiring structure 149 and the second wiring structure 150 are integrated with each other to form the wiring structure between the first substrate 101 and the second substrate 121. Here, in the bonding, it is possible to employ a connection member such as a micro bonding in between, or to adopt metal bonding. Such bonding is achieved by the connection portion 311 and the connection portion 314.

And, the pad 313 of the solid-state imaging device for signal exchange with the exterior is arranged on top of the main face 122 of the second member 309, and an opening 100 is provided on the first member 308 side. And, the protection diode circuit 315 can be arranged inwardly with respect to the pad 313 in planar direction which is parallel to the main face 122. That is, from the end faces of the first substrate and the second substrate, the pad 311 and the protection diode circuit 315 are arranged in this order such that the protection diode circuit 315 is positioned between the pad 311 and the peripheral circuit part. The pad 313 and the protection diode circuit 315 can partially overlap each other in planar direction. Owing to this construction, there is no need to provide an opening in the second member 309, so that it is possible to suppress intrusion of water into the peripheral circuit part of the second member 309. Further, in the present exemplary embodiment, the number of elements arranged in proximity to the pad part of the first member 308 can be easily made smaller than the number of elements arranged in proximity to the pad part of the second member 309. And, the elements arranged in proximity to the pad part of the first member 308 can be more spaced apart from each other than the elements arranged in proximity to the pad part of the second member 309. Thus, it is possible to further mitigate the influence of water from the opening 100 for the pads on the elements. Further, owing to the arrangement on the back-side face side of the first member 308, the connection of the terminal to the pad 313 is facilitated, thereby reducing poor connection. Further, since the pad 313 and the protection diode circuit 315 overlap each other in planar direction, it is possible to form the electrical connection from the pad 313 to the protection diode circuit 315 in a short distance. Further, the protection diode circuit 315 is formed on the second member 309, that is, the second substrate 121. Suppose the protection diode circuit 315 is arranged on the first substrate 101. Then, there is a possibility of external noise incorporating the photoelectric conversion element, which is an analog circuit, if there occurs erroneous input or incorporation of external noise from the pad 313. Specifically, owing to the configuration of the protection diode circuit of the present invention, it is possible to obtain a solid-state imaging device in which external nose is suppressed.

Figure 4A:
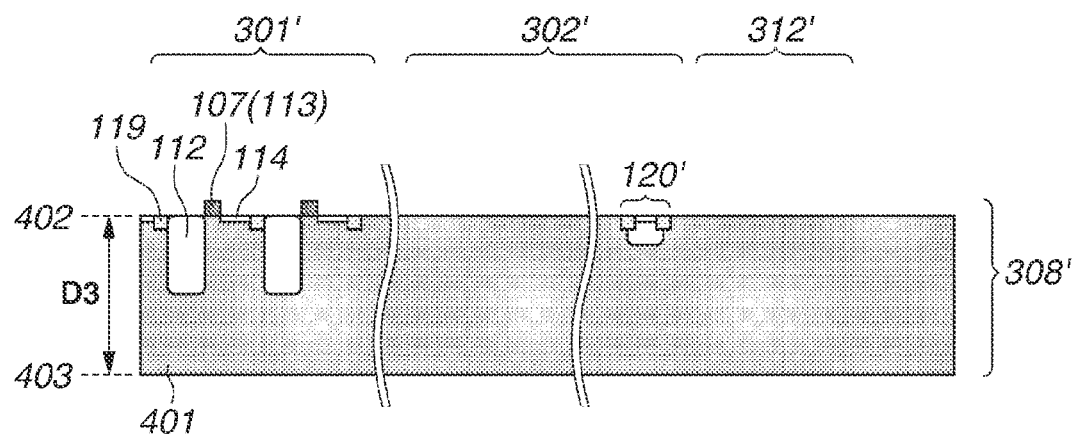
FIG. 4A is a schematic sectional view illustrating a method of manufacturing the solid-state imaging device of the first exemplary embodiment.
Figure 4B:
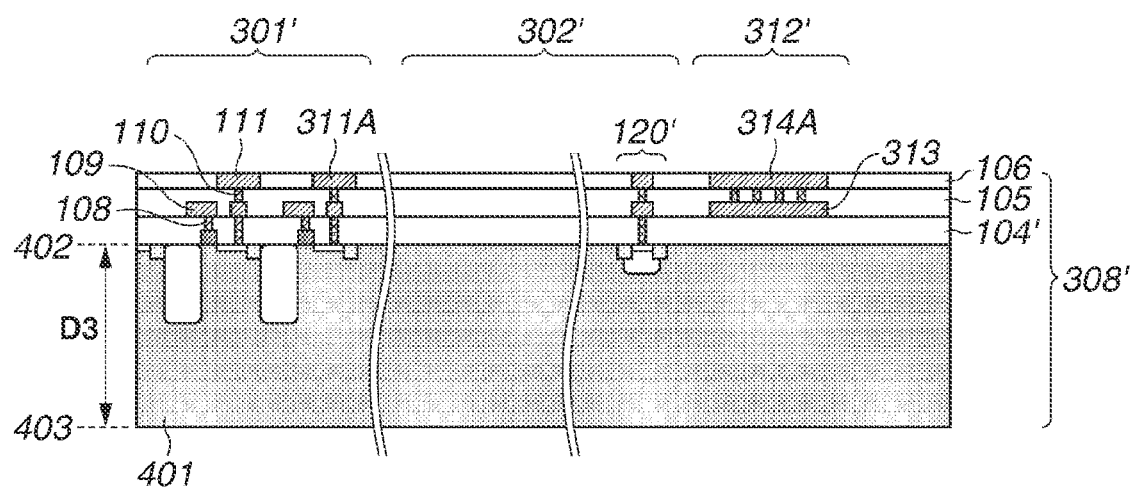
FIG. 4B is a schematic sectional view illustrating a method of manufacturing the solid-state imaging device of the first exemplary embodiment.
Figure 5A:
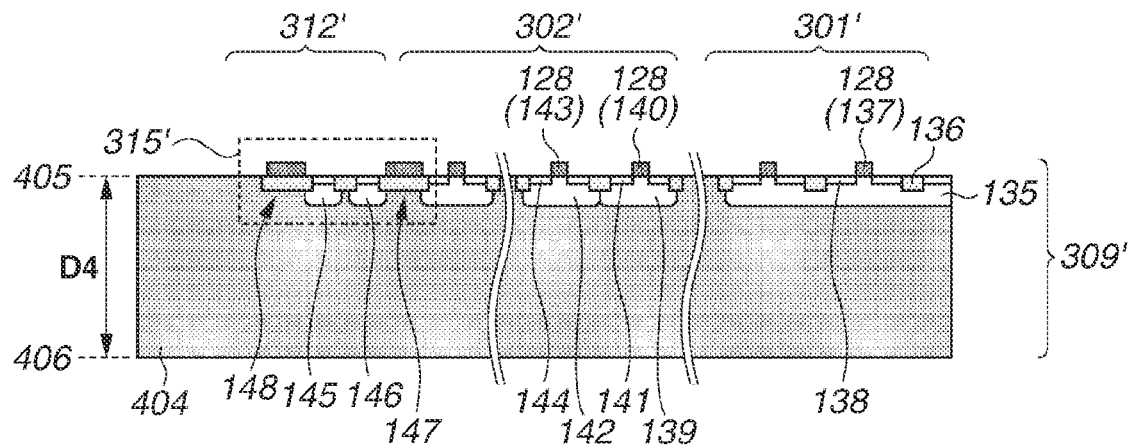
FIG. 5A is a schematic sectional view illustrating a method of manufacturing the solid-state imaging device of the first exemplary embodiment.
Figure 5B:
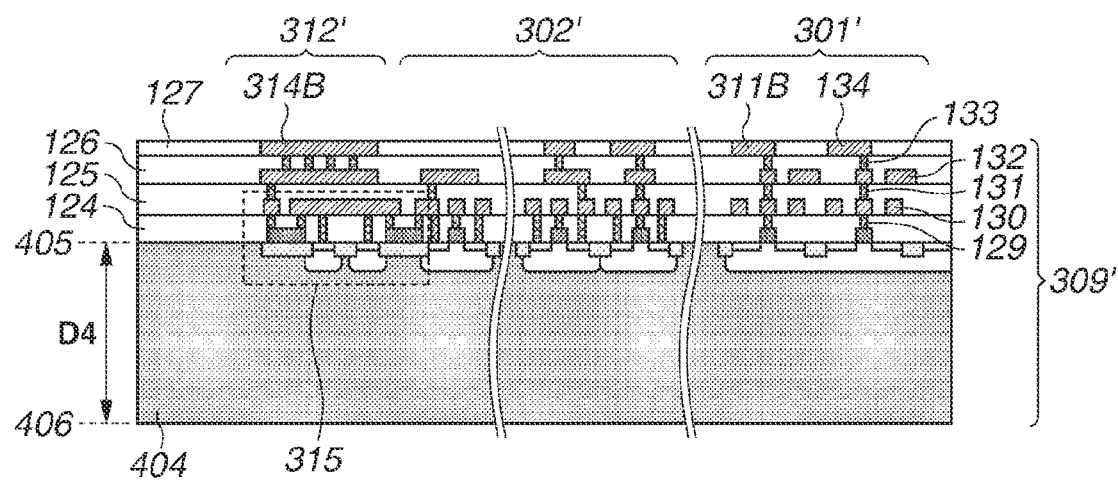
FIG. 5B is a schematic sectional view illustrating a method of manufacturing the solid-state imaging device of the first exemplary embodiment.
Figure 6A:
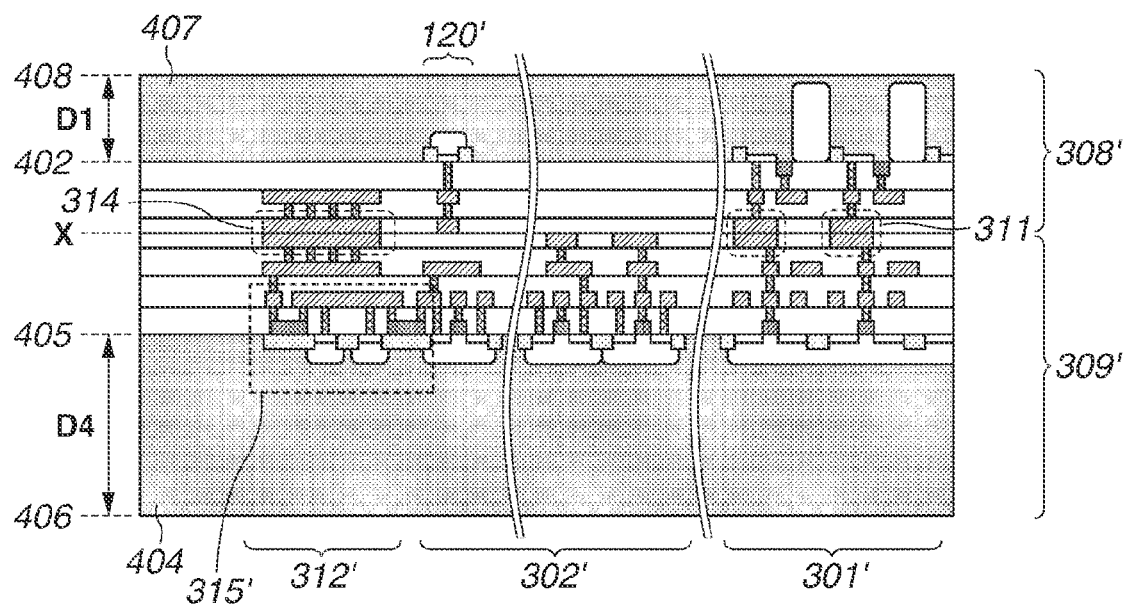
FIG. 6A is a schematic sectional view illustrating a method of manufacturing the solid-state imaging device of the first exemplary embodiment.
Figure 6B:
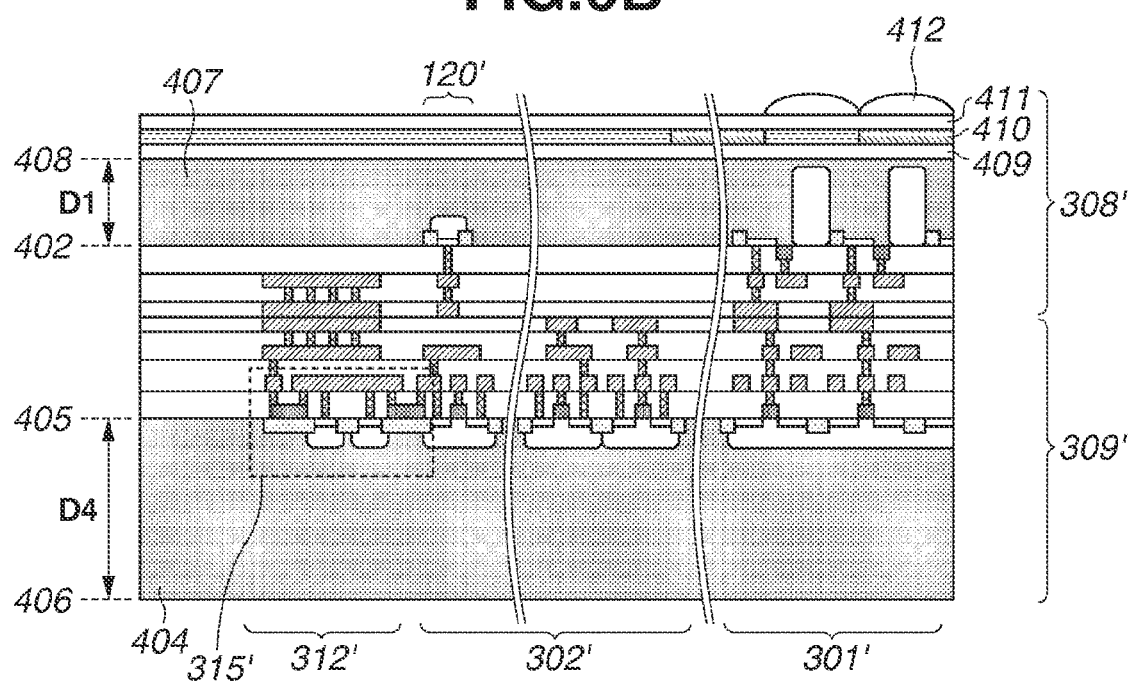
FIG. 6B is a schematic sectional view illustrating a method of manufacturing the solid-state imaging device of the first exemplary embodiment.

Next, a method of manufacturing the solid-state imaging device of the present exemplary embodiment will be described with reference to FIGS. 4A, 4B, 5A, 5B, 6A, and 6B. FIGS. 4A and 4B are schematic sectional views illustrating the step of producing the first member 308, FIGS. 5A and 5B are schematic sectional views illustrating the step of producing the second member 309, and FIGS. 6A and 6B are schematic sectional views illustrating the manufacturing step after the bonding of the first member 308 and the second member 309.

The step of producing the first member 308 of FIG. 1 will be described with reference to FIGS. 4A and 4B. In FIGS. 4A and 4B, the structure constituting the first member 308 of FIG. 1 layer is denoted by numeral 308', and the portions constituting the pixel part 301 of FIG. 1, the peripheral circuit part 302, the pad part 312, and the circuit element 120, which is a part of the peripheral circuit, are respectively denoted by numerals 304', 302', 312', and 120'.

First, a semiconductor substrate is prepared, and elements are formed on the semiconductor substrate. A semiconductor substrate 401 of a thickness D3 having a main face 402 and a back-side face 403 is prepared. The semiconductor substrate 401 is composed, for example, of a silicon semiconductor substrate. And element separation structure 119 is formed on the semiconductor substrate 401. The element separation structure 119 includes an insulating member such as a silicon oxide film, and has, for example, a local-oxidation-of-silicon (LOCOS) structure or a shallow trench isolation (STI) structure. And, an arbitrary conductive type well (not illustrated) is formed in the semiconductor substrate 401. After this, the n-type semiconductor regions 112 and 114 constituting the photoelectric conversion element and the transistor and the p-type semiconductor region (not illustrated) are formed. Further, there is formed a gate electrode layer 107 including the gate electrode 113 of the transfer transistor. The gate electrode layer is formed by deposition and patterning of a poly silicon layer, can include not only a gate electrode but also wiring. Regarding the method of forming the gate electrode, the element separation structure, and the semiconductor regions, it is possible to adopt an common semiconductor process, and a detailed description thereof will be omitted. By the above process, the configuration as illustrated in FIG. 4A is obtained.

Next, a wiring structure is formed on the main face 402 of the semiconductor substrate 401. The wiring structure has inter-layer insulating films 104', 105, and 106, contact layers 108 and 110, and wiring layers 109 and 111. The inter-layer insulating film 104' layer constitutes later the inter-layer insulating film 104 of FIG. 1. The inter-layer insulating film 104' covers the gate electrode layer 107, the contact layer 108 is arranged in the inter-layer insulating film 104', and the wiring layer 109 is arranged on the inter-layer insulating film 104'. The inter-layer insulating film 105 covers the wiring layer 109, the contact layer 110 is arranged in the inter-layer insulating film 105, the wiring layer 111 is arranged on the inter-layer insulating film 105, and the inter-layer insulating film 106 is arranged on the inter-layer insulating film 105 and has an opening through which the wiring of the wiring layer 111 is exposed. The upper face of the wiring structure is formed by the upper face of the inter-layer insulating film 106 and the upper face of the wiring layer 111.

The inter-layer insulating film is formed by a silicon oxide film, a silicon nitride film, an organic resin or the like, and the wiring layer consists of wiring whose main component is aluminum or wiring whose main component is copper. The contact is formed, for example, of tungsten, and the via is formed of tungsten or integrally with wiring whose main component is copper. The wiring layer 111 includes connection portions 314A and 311A, and is formed of wiring whose main component is copper. The wiring layer 109 is formed of wiring whose main component is aluminum. The pad 313 is arranged in the same layer as the wiring layer 109, and contains aluminum as the main component. The wiring layer, the contact layer, the inter-layer insulating film, and the pad can be formed by an common semiconductor process, and a detailed description thereof will be omitted. By the above process, the configuration as illustrated in FIG. 4B is obtained. In FIG. 4B, the components that are denoted by numerals 104', 105, 106, and 108 through 111 later constitute the wiring structure 149 of FIG. 1. The connection portion 311A later constitutes the connection portion 311.

Next, the process for manufacturing the second member 309 of FIG. 1 will be described with reference to FIG. 5. In FIG. 5, the component later constituting the second member 309 of FIG. 1 is denoted by numeral 309', and the portions later constituting the pixel part 301, the peripheral circuit part 302, the pad part 312, and the protection diode circuit 315 are denoted by numerals 304', 302', 312', and 315'.

First, a semiconductor substrate is prepared, and elements are formed on the semiconductor substrate. A semiconductor substrate 404 of a thickness D4 having a main face 405 and a back-side face 406 is prepared. And, an element separation structure 136 is formed on the semiconductor substrate 404 using the LOCOS structure, the STI structure or the like. Further, p-type wells 135 and 139 and an n-type well 142 are formed in the semiconductor substrate 404. After this, n-type semiconductor regions 138 and 141 that may constitute a source/drain region constituting a transistor, a p-type semiconductor region 144, and a semiconductor region constituting a diode are formed. And, a gate electrode layer 128 including the gate electrodes 137, 140, and 143 of the transistor and wiring (resistor) is formed by deposition of a poly silicon layer and patterning. Regarding the method of forming the gate electrode, the element separation structure, and the semiconductor region, it is possible to adopt a common semiconductor process, and a detailed description thereof will be omitted. By the above process, the configuration of FIG. 5A can be obtained.

Next, a wiring structure is formed on the main face 405 of the semiconductor substrate 404. The wiring structure has inter-layer insulating films 124 through 127, contact layers 129, 131, and 133, and wiring layers 130, 132, and 134. The inter-layer insulating film 124 covers the gate electrode layer 128, the contact layer 129 is arranged in the inter-layer insulating film, 124, and the wiring layer 130 is arranged on the inter-layer insulating film 124. Further, the inter-layer insulating film 125 covers the wiring layer 130, the contact layer 131 is arranged in the inter-layer insulating film 125, the wiring layer 132 is arranged on the inter-layer insulating film 125, and the inter-layer insulating film 126 covers the wiring layer 132 and is arranged on the inter-layer insulating film 125. And, the contact layer 133 is arranged in the inter-layer insulating film 126, the wiring layer 134 is arranged on the inter-layer insulating film 126, and the inter-layer insulating film 127 is arranged on the inter-layer insulating film 126 and has an opening through which the wiring of the wiring layer 134 is exposed. The upper face of the wiring structure is formed by the upper face of the inter-layer insulating film 127 and the upper face of the wiring layer 134.

The inter-layer insulating film is a silicon oxide film. It may also be formed of a silicon nitride film, organic resin or the like. The wiring layer is composed of wiring whose main component is aluminum or wiring whose main component is copper. The wiring layer 134 includes a connection portion 314B and 311B, and is formed by wiring whose main component is copper. Regarding the method of forming the wiring layer, the contact layer, and the inter-layer insulating film, it is possible to adopt a common semiconductor process, and a detailed description thereof will be omitted. By the above process, the construction of FIG. 5B can be obtained. In FIG. 5B, the components indicated by numerals 124 through 127, 129 through 134, etc. later constitute the first wiring structure 150 of FIG. 1. Further, the connection portion 311B later constitutes the connection portion 311.

The first member 308' and the second member 309' illustrated in FIGS. 4B and 5B are bonded to each other such that the main face 402 and the main face 405 of the respective semiconductor substrates are opposed to each other. Specifically, the uppermost face of the wiring structure of the first member 308' and the uppermost face of the wiring structure of the second member 309' are bonded to each other. The connection portions 311A and 311B and the connection portions 314A and 314B are formed of wirings whose main component is copper, so that the bonding can be effected through copper metal bonding.

After the first member 308' and the second member 309' have been bonded to each other, the back-side face 403 side of the semiconductor substrate 401 of the first member 308' is thinned. The thinning can be effected by chemical-mechanical polishing (CMP), etching or the like. And, the semiconductor substrate 401 is turned into the semiconductor substrate 407, with the thickness being changed from D3 to D1 (D1<D3) (FIG. 6A). By thus thinning the semiconductor substrate 401 into the semiconductor substrate 407, it is possible later to allow the incident light to efficiently enter the photoelectric conversion element. Further, at this time, the thickness D1 of the semiconductor substrate 407 is smaller than the thickness D4 of the semiconductor substrate 404 (D1<D4).

Next, a planarization layer 409 consisting of resin, a color filter layer 410, a planarization layer 411 consisting of resin, and a micro lens layer 412 in this order are formed on the back-side face 408 of the semiconductor substrate 407. Regarding the method of producing the planarization layers, the cooler filter layer, and the micro lens layer, it is possible to adopt a common semiconductor process, and a detailed description thereof will be omitted. Here, the micro lens layer may be formed up to the region of 312' constituting the pad part. By the above process, the construction of FIG. 6B is obtained.

And, an opening 100 for exposing the pad 313 is formed. Here, using photolithography, a photoresist mask having an arbitrary opening is provided on the micro lens layer 412. And, by using dry etching, the micro lens layer 412, the flattened layer 411, the color filter layer 410, the flattened layer 409, the semiconductor substrate 407, and the inter-layer insulating film 104' are removed to form the opening 100 for exposing the pad 313.

And, the micro lens layer 118, the planarization layers 117 and 115, the color filter layer 116, the first substrate 101, and the inter-layer insulating film 104 are formed. In this way, the configuration of FIG. 1 is obtained. The semiconductor substrate 404, the main face 405, the back-side face 406, and the thickness D4 of FIG. 6B respectively correspond to the second substrate 121, the main face 122, the back-side face 123, and the thickness D2 of FIG. 1.

Here, there is no change between the thickness D4 and the thickness D2; however, it is also possible to thin the semiconductor substrate 404 so that the thickness D2 may be smaller than the thickness D4 (D2<D4). The thinning involves an increase in the number of steps, but it helps to achieve a reduction in the size of the solid-state imaging device.

As described above, the etching for exposing the pad is conducted from the back-side face 408 side of the thinned semiconductor substrate 407, whereby it is possible to shorten the requisite time for the etching for pad formation. Further, the pad 313 can be formed by the same step as the wiring of the wiring layer 109, enabling to achieve a reduction in man-hours. And, as in the present exemplary embodiment, the pad 313 can be formed of a metal whose main component is aluminum to achieve a reduction in the connection resistance with the external terminal. At the time of etching, the pad 313 can also function as an etching stopper.

In the present invention, the manufacturing method is not restricted to the process described above, but allows modification in the order of steps. The order in which the first member 308 and the second member 309 are produced can be set as appropriate. Further, it is also possible to purchase the first member 308 and the second member 309 and to bond them to each other. Further, silicon-on-insulator (SOI) substrates are applicable as the semiconductor substrates 401 and 402.

In the present exemplary embodiment, the second substrate 121 is thicker than the first substrate 101. By providing the protection diode circuit 315 on such a thick substrate, propagation of voltage fluctuation in the substrate due to external noise is mitigated, enabling to reduce the influence of external noise.

Figure 7A:
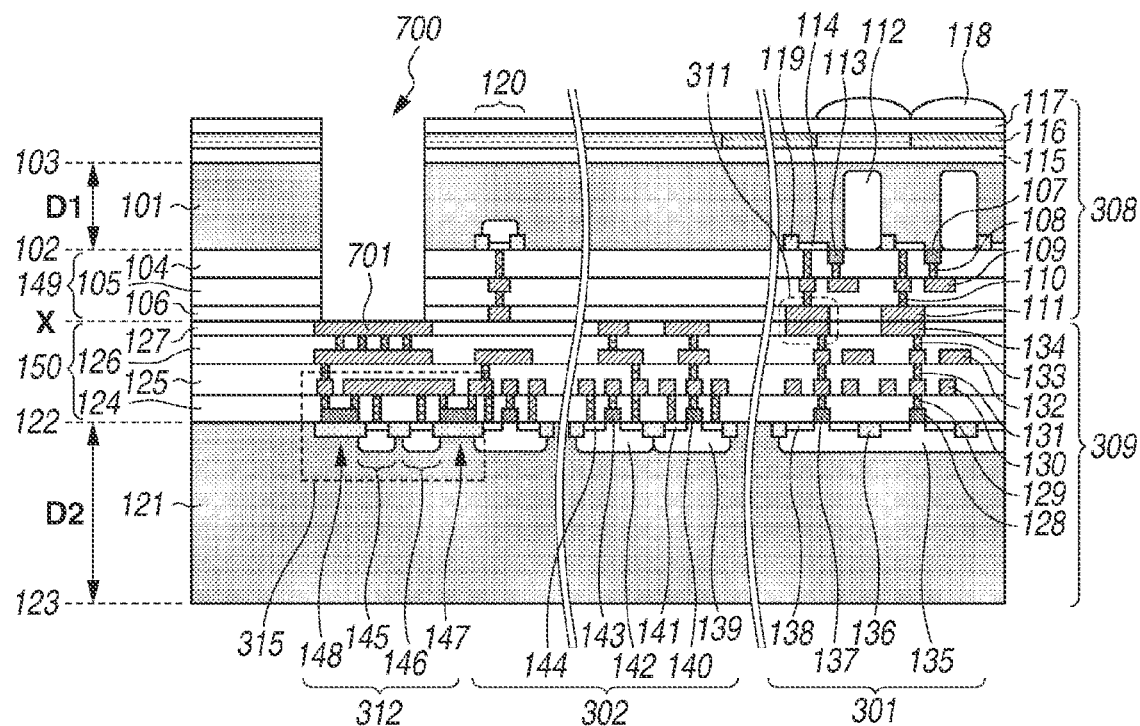
FIG. 7A is a schematic sectional view of a solid-state imaging device according to a second exemplary embodiment.
Figure 7B:
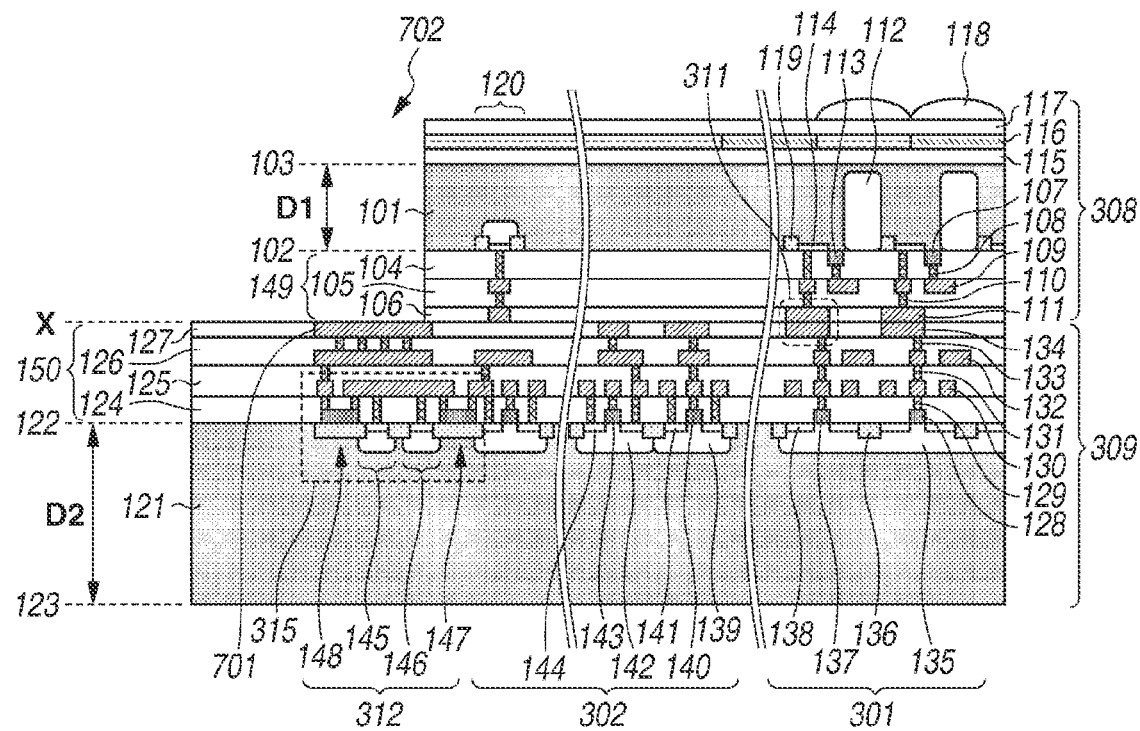
FIG. 7B is a schematic sectional view of a solid-state imaging device according to a second exemplary embodiment.

The second exemplary embodiment of the present invention will be described with reference to FIGS. 7A and 7B. FIGS. 7A and 7B are schematic sectional views of a solid-state imaging device each of which corresponds to FIG. 1. In FIGS. 7A and 7B, the components that are the same as those of FIG. 1 are denoted by the same reference numerals, and a description thereof will be omitted.

The present exemplary embodiment differs from the first exemplary embodiment in an opening 700 in FIG. 7A and an opening 702 and a pad 701 in FIG. 7B. In the present exemplary embodiment, there are provided the opening 700 and the opening 702, which are deeper than that of the first exemplary embodiment, and there is provided the pad 701, which is closer to the main face 122 of the second member 309 than in the first exemplary embodiment. In this way, the pad may be arranged at any position so long as it is arranged on the first member 308 side of the main face 122 of the second member 309. However, by arranging the pad in proximity to the second member 309 as in the present exemplary embodiment, it is possible to reduce the connection resistance of the pad as compared with the first exemplary embodiment. In the present exemplary embodiment also, the protection diode is arranged on the second substrate.

Further, in FIG. 7B, the configuration of the opening 702 is different from that of the opening 100 of the first exemplary embodiment. As illustrated in FIG. 7B, the unnecessary inter-layer insulating film and semiconductor substrate may be removed.

The pad 701 is arranged in the same layer as the wiring layer 134 of the second member 309. Here, the term "the same layer" means a layer which is formed by the same process or a layer of which the height from the main face to the bottom face or the upper face of the member is the same. The pad 701 is included in the same layer as the wiring layer 134, and is formed by the same process. Although in the present exemplary embodiment there is adopted wiring whose main component is copper as in the first exemplary embodiment, it is more desirable to adopt wiring whose main component is aluminum for the wiring layer 134 since it is the same layer as the pad 701. In this case, the connection portion 311 may be bonded by a micro bump or the like.

As in the present exemplary embodiment, at no matter what position the pad 701 may be arranged, the protection diode circuit 315 is arranged on the second substrate. Owing to this construction, it is possible to suppress incorporation of external noise into the photoelectric conversion element from the pad 701. Further, in the present exemplary embodiment also, by providing the protection diode circuit 315 on a thick substrate, the propagation of voltage fluctuation in the substrate due to external noise is mitigated, thereby enabling to achieve a reduction in the influence of external noise.

Figure 8A:
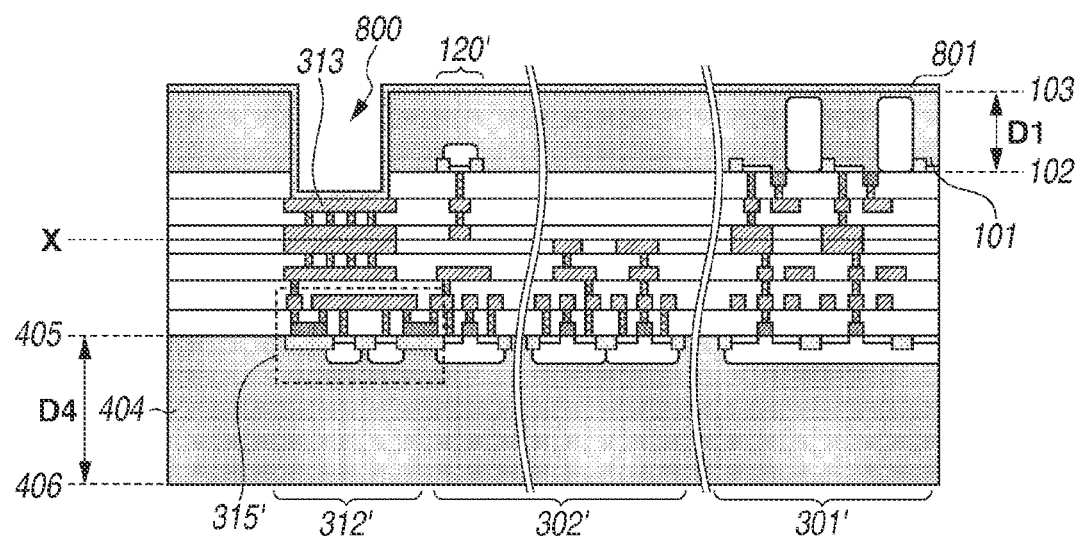
FIG. 8A is a schematic sectional view illustrating a solid-state imaging device according to a third exemplary embodiment and a method of manufacturing the same.
Figure 8B:
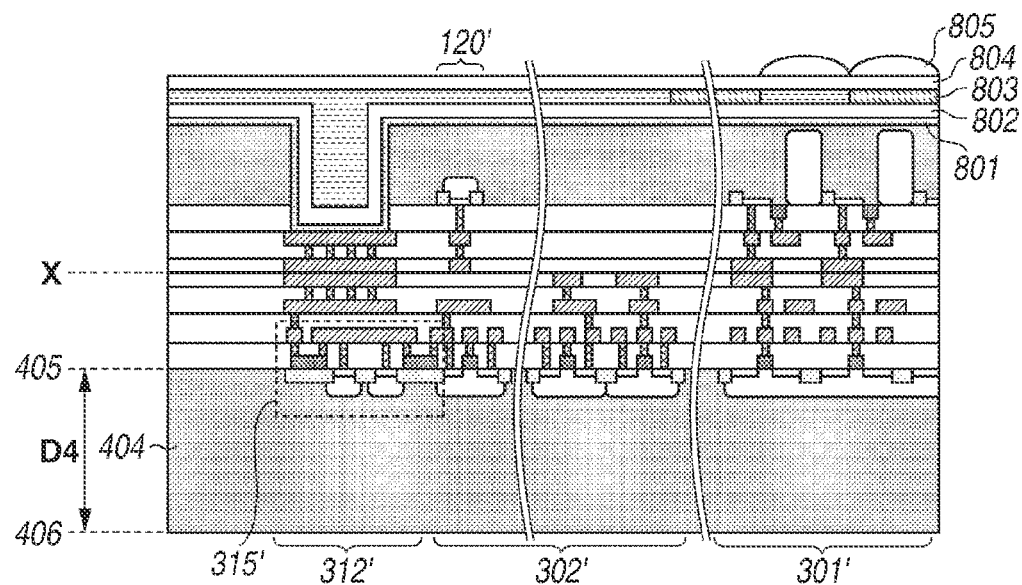
FIG. 8B is a schematic sectional view illustrating a solid-state imaging device according to a third exemplary embodiment and a method of manufacturing the same.
Figure 8C:
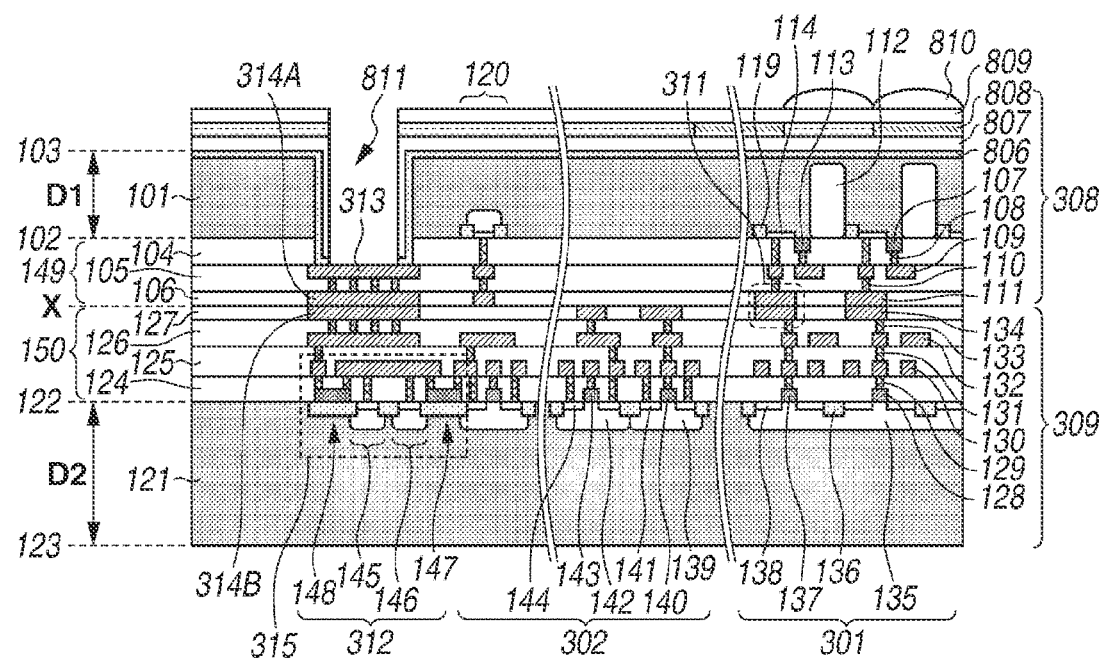
FIG. 8C is a schematic sectional view illustrating a solid-state imaging device according to a third exemplary embodiment and a method of manufacturing the same.

The third exemplary embodiment of the present invention will be described with reference to FIGS. 8A through 8C. FIG. 8C is a schematic sectional view of a solid-state imaging device of the present exemplary embodiment; the diagram corresponds to FIG. 1. FIGS. 8A and 8B are schematic sectional views for illustrating a method of manufacturing the solid-state imaging device of the present exemplary embodiment; the diagrams correspond to FIGS. 6A and 6B. In FIGS. 8A through 8C, the components that are the same as those of FIGS. 6A and 6B are denoted by the same reference numerals, and a description thereof will be omitted.

The present exemplary embodiment differs from the first exemplary embodiment in the construction of an opening 811 and of a protection film 806 in FIG. 8C. The protective film 806 of the present exemplary embodiment covers the side wall (side face) of the first substrate 101 having the opening 811. Owing to providing the protection film 806, it is possible to suppress intrusion of water into the device from the opening 811. When an external terminal for connecting to the pad 313 comes into contact to a conductive body such as the first substrate 101, leakage is generated. The protection film 806 prevents the external terminal from coming into contact with a conductive body, and suppresses generation of leakage. Further, the protection film of the present exemplary embodiment is also arranged on the incidence surface of the photoelectric conversion portion of the pixel part 301 (that is, the back-side face 103 of the first substrate 101), and also can function as a reflection prevention film. Since the protection film 806 is provided, the configuration of the opening differs from that of the first exemplary embodiment. Further, the configuration of a planarization layer 807, of a color filter layer 808, of a planarization layer 809, and of a micro lens layer 810 may also be changed into different configuration from that of the first exemplary embodiment.

The manufacturing method of the present exemplary embodiment will be described with reference to FIGS. 8A and 8B. The portion of the method up to the stage of FIG. 6A of the first exemplary embodiment is the same as that described above, so a description thereof will be omitted. An opening 800 is formed in the semiconductor substrate 407 of FIG. 6A by photolithography and etching to form the first substrate 101. The opening 800 is formed to expose the pad 313. After this, a silicon nitride film 801 that can serve as a protection film is formed by a plasma chemical-vapor deposition (CVD) method or the like to cover the side face of the opening 800 and to cover the back-side face 103 of the first substrate 101, whereby the construction of FIG. 8A is obtained.

After this, a planarization layer 802, a color filter layer 803, a planarization layer 804, and a micro lens layer 805 are formed in this order. The materials and the manufacturing method are the same as those of the first exemplary embodiment. And, an opening 811 is formed. The opening 811 extends through the silicon nitride film 801, the flattened layer 802, the color filter layer 803, the flattened layer 804, and the micro lens layer 805, and exposes the pad 313. Here, the silicon nitride layer 801, the planarization layer 802, the color filter layer 803, the planarization layer 804, and the micro lens layer 805 respectively constitute the protection film 806, the planarization layer 807, the color filter layer 808, the planarization layer 809, and the micro lens layer 810. And, the solid-state imaging device as illustrated in FIG. 8C is produced.

In the present exemplary embodiment also, the protection diode is arranged on the second substrate. Owing to this configuration, it is possible to suppress incorporation of external noise into the photoelectric conversion element from the pad 313. Further, in the present exemplary embodiment also, by providing the protection diode circuit 315 on a thick substrate, propagation of voltage fluctuation in the substrate due to external noise is mitigated, enabling to reduce the influence of external noise.

Figure 9:
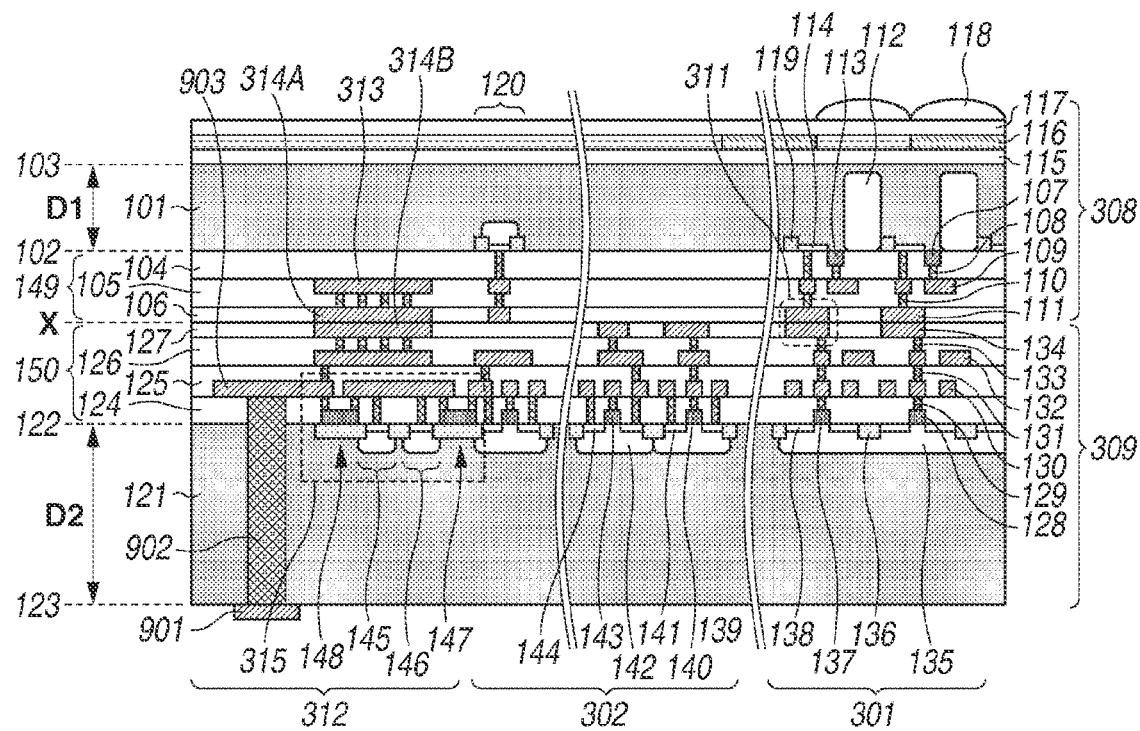
FIG. 9 is a schematic sectional view of a solid-state imaging device according to a fourth exemplary embodiment.

The fourth exemplary embodiment of the present invention will be described with reference to FIG. 9. FIG. 9 is a schematic sectional view of a solid-state imaging device; the diagram corresponds to FIG. 1. In FIG. 9, the components that are similar to those of FIG. 1 are denoted by the same reference numerals, and a description thereof will be omitted.

The present exemplary embodiment differs from the first exemplary embodiment in that there is adopted a through-type electrode 902 and that a pad 901 is arranged on the back-side face 134 side of the second substrate 121. The through-type electrode 902 is connected to wiring 903 included in the wiring layer 130, and the wiring 903 and the input terminal IN of the protection diode circuit 315 are formed by the same wiring. Regarding the method of forming the through-type electrode, etc., it is possible to adopt a common semiconductor process, and a description thereof will be omitted.

As in the first exemplary embodiment, in this construction also, the protection diode circuit 315 is arranged on the second substrate 121. Thus, also in the configuration of the present exemplary embodiment, it is possible to reduce external noise.

As an application example of the solid-state imaging devices of the above-described exemplary embodiments, an imaging system with a solid-state imaging device incorporated therein will be described. The term imaging system covers not only an apparatus such as a camera mainly intended for photographing, but also an apparatus equipped with a photographing function as an auxiliary function (e.g., a personal computer and a personal digital assistant). For example, a camera includes a solid-state imaging device according to the present exemplary embodiment, and a processing unit configured to process signals output from the solid-state imaging device. This processing unit may include, for example, an A/D converter, and a processor configured to process digital data output from the A/D converter.

As described above, in the solid-state imaging device of the present invention, it is possible to suppress incorporation of external noise from the pad. Although in the above-described exemplary embodiments a protection diode circuit is adopted as an example of the protection circuit provided for the second substrate 121 to suppress incorporation of external noise, this should not be construed restrictively; the same effect can be attained by using a protection circuit employing a transistor.

The present invention is not restricted to the construction as described in this specification; it is also possible, for example, to change a conductive type and a circuit to a reverse conductive type. Further, although in the above exemplary embodiments the connection portion consists of the wiring of a wiring layer, it may consist of any other structure so long as it allows securing conduction; thus, it may also be a via or a micro bump. Further, the constructions of the above exemplary embodiments may be combined with each other as appropriate.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

REFERENCE SIGNS LIST 301 pixel part
302 peripheral circuit part
308 first member
309 second member
149 first wiring structure
150 second wiring structure
312 pad part
313 pad
315 protection diode circuit
101 first substrate
121 second substrate
100 opening
X bonding interface

The invention claimed is:

1. A device comprising:
a first semiconductor substrate which includes a photoelectric conversion element;
a second semiconductor substrate which includes a transistor; and
a wiring structure which is arranged between the first semiconductor substrate and the second semiconductor substrate,
wherein the first semiconductor substrate is provided with an opening,
wherein the second semiconductor substrate includes semiconductor regions and an insulating member,
wherein the semiconductor regions include a first semiconductor region and a second semiconductor region separated from the first semiconductor region by the insulating member, and
wherein the opening and at least one of the insulating member, the first semiconductor region and the second semiconductor regions overlap each other, or the opening and a poly silicon portion arranged between the wiring structure and the second semiconductor substrate overlap each other.

2. The device according to claim 1,
wherein a first conductor portion and a second conductor portion are bonded to each other at a bonding interface between the first semiconductor substrate and the second semiconductor substrate, and
wherein the opening and the insulating member overlap each other, the opening and the first and the second semiconductor regions overlap each other, the opening and the poly silicon portion overlap each other, and the opening and the first and second conductor portions overlap each other.

3. The device according to claim 1,
wherein the opening penetrates from a light incident surface of the first semiconductor substrate to a surface, which is opposite to the light incident surface, of the first semiconductor substrate.

4. The device according to claim 1,
wherein a pad exposed through the opening is connected to an external terminal.

5. The device according to claim 4,
wherein the pad contains aluminum.

6. The device according to claim 1,
wherein the second semiconductor substrate includes at least one of a diode which overlaps the opening and the transistor which overlaps the opening.

7. The device according to claim 1,
wherein a protection film is provided over the opening.

8. The device according to claim 1,
wherein the wiring structure includes a first wiring structure and a second wiring structure, the first wiring structure includes a first insulating film, the second wiring structure includes a second insulating film, and the first wiring structure and the second wiring structure are bonded to each other so that the first insulating film and the second insulating film contact each other.

9. The device according to claim 8,
wherein the first wiring structure includes a first wiring layer and a second wiring layer arranged between the first wiring layer and the second wiring structure,
wherein the second wiring structure includes a third wiring layer,
wherein the opening is arranged above a part of the first wiring layer, and wherein the part of the first wiring layer is electrically connected to the third wiring layer via the second wiring layer.

10. The device according to claim 9, wherein the first wiring layer includes a first wiring, the second wiring layer includes a second wiring electrically connected to the first wiring, and the third wiring layer includes a third wiring electrically connected to the second wiring and the second semiconductor substrate.

11. The device according to claim 10, wherein the third wiring is electrically connected to at least one of the first and the second semiconductor regions.

12. The device according to claim 10, wherein the third wiring is electrically connected to the poly silicon portion.

13. The device according to claim 1,
wherein the insulating member contains one of a LOCOS structure and a STI structure.

14. A system comprising:
the device according to claim 1; and
a processing unit configured to process a signal output from the device.

15. A device comprising:
a first semiconductor substrate which includes a photoelectric conversion element;
a second semiconductor substrate which includes a transistor;
a first wiring structure arranged between the first semiconductor substrate and the second semiconductor substrate; and
a second wiring structure arranged between the first wiring structure and the second semiconductor substrate;
wherein the first semiconductor substrate is provided with an opening,
wherein the first wiring structure includes a plurality of first conductor portions and a first insulator portion, and, in a cross sectional view, the first insulator portion is arranged between one of the plurality of first conductor portions and another of the plurality of first conductor portions,
wherein the second wiring structure includes a plurality of second conductor portions and a second insulator portion, and, in the cross sectional view, the second insulator portion is arranged between one of the plurality of second conductor portions and another of the plurality of second conductor portions,
wherein in a bonding interface between the first wiring structure and the second wiring structure, the one of the plurality of first conductor portions and the one of the plurality of second conductor portions are bonded, the another of the plurality of first conductor portions and the another of the plurality of second conductor portions are bonded, and the first insulator portion and the second insulator portion are bonded,
wherein the one of the plurality of first conductor portions is electrically connected to a first wiring of the first wiring structure via a first plurality of vias, and
wherein the opening overlaps the one of the plurality of first conductor portions, the one of the plurality of second conductor portions and at least one of the first plurality of vias.

16. The device according to claim 15,
wherein the one of the second conductor portions is electrically connected to a second wiring of the second wiring structure via a second plurality of vias; and
wherein the opening overlaps at least one of the second plurality of vias.

17. The device according to claim 15, wherein the second semiconductor substrate includes at least one of a diode which overlaps the opening and the transistor which overlaps the opening.

18. The device according to claim 15, wherein a protection film is provided over the opening.

19. The device according to claim 15,
wherein the first wiring structure includes a first wiring layer and a second wiring layer arranged between the first wiring layer and the second wiring structure,
wherein the second wiring structure includes a third wiring layer,
wherein the opening is arranged above a part of the first wiring layer, and
wherein the part of the first wiring layer is electrically connected to the third wiring layer via the second wiring layer.

20. The device according to claim 19,
wherein the first wiring layer includes a first wiring, the second wiring layer includes a second wiring electrically connected to the first wiring, and the third wiring layer includes a third wiring electrically connected to the second wiring and the second semiconductor substrate.

21. The device according to claim 20,
wherein the second wiring is arranged between the first wiring layer and the third wiring.

22. The device according to claim 20,
wherein the part of the first wiring layer is electrically connected to the second wiring via at least one of the first plurality of vias.

23. The device according to claim 20,
wherein the transistor is connected to the photoelectric conversion element, and included in a signal processing circuit at least partially arranged on the second semiconductor substrate.

24. The device according to claim 20, wherein the second wiring and the third wiring are bonded to each other.

25. The device according to claim 20, wherein the second wiring and the third wiring contain copper.

26. A system comprising:
the device according to claim 15; and
a processing unit configured to process a signal output from the device.

27. The device according to claim 15, wherein a pad exposed through the opening is connected to an external terminal.

28. The device according to claim 27, wherein the pad contains aluminum.

29. A device comprising:
a first semiconductor substrate which includes a photoelectric conversion element;
a second semiconductor substrate which includes a transistor;
a first wiring structure arranged between the first semiconductor substrate and the second semiconductor substrate; and
a second wiring structure arranged between the first wiring structure and the second semiconductor substrate;
wherein the first semiconductor substrate is provided with an opening exposing a pad,
wherein the first wiring structure includes a plurality of first conductor portions and a first insulator portion, and, in a cross sectional view, the first insulator portion is arranged between one of the plurality of first conductor portions and another of the plurality of first conductor portions, wherein the second wiring structure includes a plurality of second conductor portions and a second insulator portion, and, in the cross sectional view, the second insulator portion is arranged between one of the plurality of second conductor portions and another of the plurality of second conductor portions, wherein in a bonding interface between the first wiring structure and the second wiring structure, the one of the plurality of first conductor portions and the one of the plurality of second conductor portions are bonded, the another of the plurality of first conductor portions and the another of the plurality of second conductor portions are bonded, and the first insulator portion and the second insulator portion are bonded, wherein the pad is electrically connected to one of the plurality of first conductor portions, and wherein the opening overlaps one of the plurality of first conductor portions.

30. The device according to claim 29, wherein one of the plurality of second conductor portions is electrically connected to a second wiring of the second wiring structure via a plurality of vias; and wherein the opening overlaps at least one of the plurality of vias.

31. The device according to claim 29, wherein the second semiconductor substrate includes at least one of a diode which overlaps the opening and the transistor which overlaps the opening.

32. The device according to claim 29, wherein a protection film is provided over the opening.

33. The device according to claim 29, wherein the first wiring structure includes a first wiring layer and a second wiring layer arranged between the first wiring layer and the second wiring structure, wherein the second wiring structure includes a third wiring layer, wherein the opening is arranged above a part of the first wiring layer, and wherein the part of the first wiring layer is electrically connected to the third wiring layer via the second wiring layer.

34. The device according to claim 33, wherein the first wiring layer includes a first wiring, the second wiring layer includes a second wiring electrically connected to the first wiring, and the third wiring layer includes a third wiring electrically connected to the second wiring and the second semiconductor substrate.

35. The device according to claim 34, wherein the second wiring is arranged between the first wiring layer and the third wiring.

36. The device according to claim 34, wherein the part of the first wiring layer is electrically connected to the second wiring via a plurality of vias.

37. The device according to claim 34, wherein the transistor is electrically connected to the photoelectric conversion element, and included in a signal processing circuit at least partially arranged on the second semiconductor substrate.

38. The device according to claim 34, wherein the second wiring and the third wiring are bonded to each other.

39. The device according to claim 34, wherein the second wiring and the third wiring contain copper.

40. A system comprising:

the device according to claim 29; and a processing unit configured to process a signal output from the device.

41. The device according to claim 29, wherein the pad exposed through the opening is connected to an external terminal.

42. The device according to claim 41, wherein the pad contains aluminum.

\* \* \* \* \*